United States Patent
Song et al.

(10) Patent No.: US 10,761,141 B2
(45) Date of Patent: Sep. 1, 2020

(54) METHOD AND APPARATUS FOR ESTIMATING BATTERY STATE

(71) Applicant: SAMSUNG ELECTRONICS CO., LTD., Suwon-si (KR)

(72) Inventors: Tae Won Song, Yongin-si (KR); Ju Wan Lim, Suwon-si (KR); Sungick Kim, Seoul (KR); Jinho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 166 days.

(21) Appl. No.: 15/712,389

(22) Filed: Sep. 22, 2017

(65) Prior Publication Data

US 2018/0136283 A1  May 17, 2018

(30) Foreign Application Priority Data

Nov. 16, 2016 (KR) .................. 10-2016-0152544

(51) Int. Cl.
*G01R 31/3828* (2019.01)
*G01R 31/3835* (2019.01)
*G01R 31/367* (2019.01)

(52) U.S. Cl.
CPC ..... *G01R 31/3828* (2019.01); *G01R 31/3835* (2019.01); *G01R 31/367* (2019.01)

(58) Field of Classification Search
CPC ............ G01R 31/2828; G01R 31/2835; G01R 31/367; G01R 31/3624; G01R 31/3648; G01R 31/3651; G01R 31/3828; G01R 31/3835; G01R 31/361
See application file for complete search history.

(56) References Cited

U.S. PATENT DOCUMENTS

| | | | |
|---|---|---|---|
| 8,887,872 B2 | 11/2014 | Chen et al. | |
| 2012/0274331 A1 | 11/2012 | Liu et al. | |
| 2015/0051855 A1* | 2/2015 | Joe | H01M 10/4285 |
| | | | 702/63 |
| 2015/0355285 A1 | 12/2015 | Nishigaki et al. | |
| 2016/0190833 A1* | 6/2016 | Roumi | H02J 7/0021 |
| | | | 320/136 |
| 2016/0272080 A1* | 9/2016 | Chang | B60L 11/1861 |
| 2018/0284194 A1* | 10/2018 | Andersson | H02J 7/0047 |

FOREIGN PATENT DOCUMENTS

| | | |
|---|---|---|
| JP | 07-098367 A | 4/1995 |
| JP | 2004-362828 A | 12/2004 |
| JP | 2008-089519 A | 4/2008 |
| KR | 10-2013-0039681 A | 4/2013 |
| WO | WO 2013/183480 A1 | 12/2013 |

* cited by examiner

*Primary Examiner* — Bryan Bui
(74) *Attorney, Agent, or Firm* — NSIP Law

(57) ABSTRACT

Provided is a method and apparatus for estimating a battery state. A method of estimating a battery state that includes determining whether a previous state to a rest state of a battery is a charging state or a discharging state; selecting a current profile comprising one or both of a charging pulse and a discharging pulse based on the previous state of the battery; stabilizing an open circuit voltage (OCV) of the battery by applying the current profile to the battery; and measuring the stabilized OCV.

20 Claims, 8 Drawing Sheets

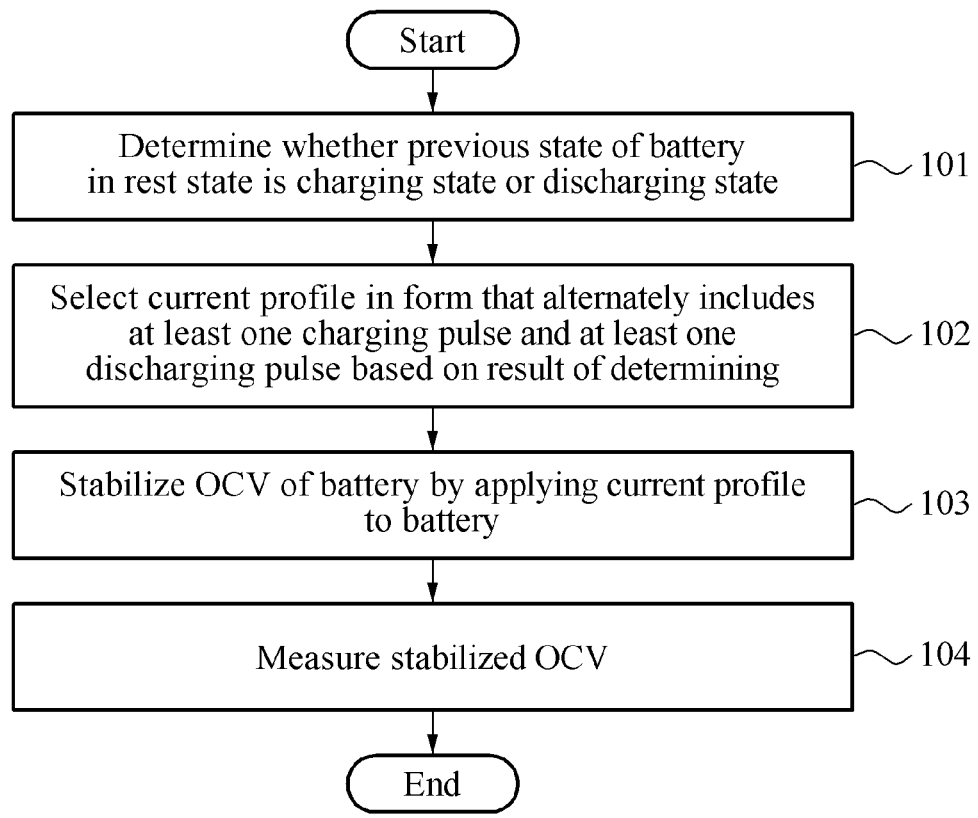

FIG. 2A
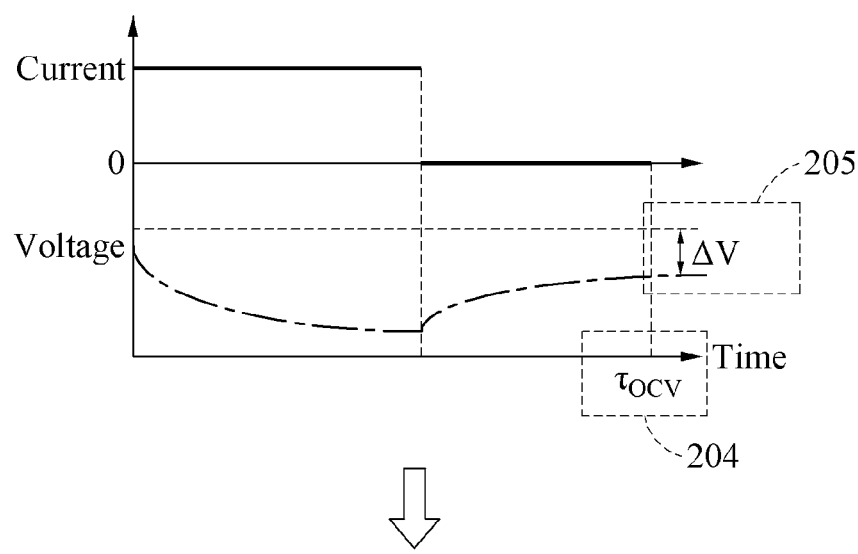
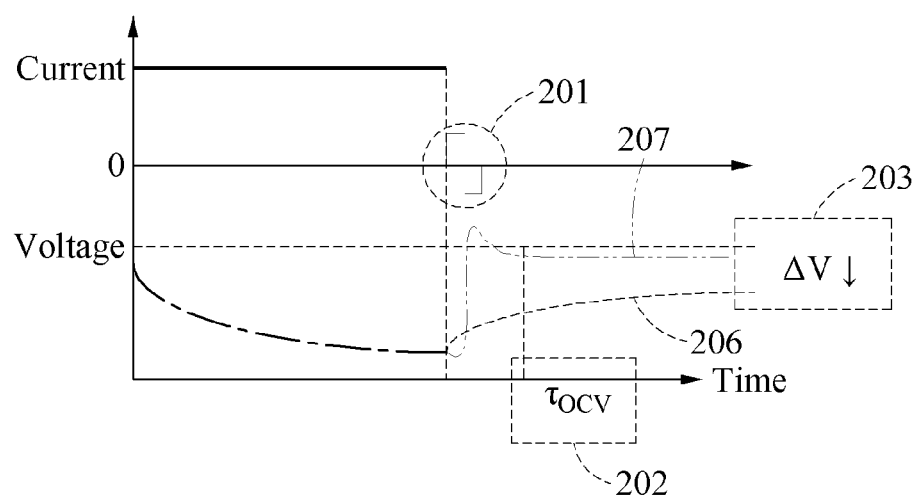

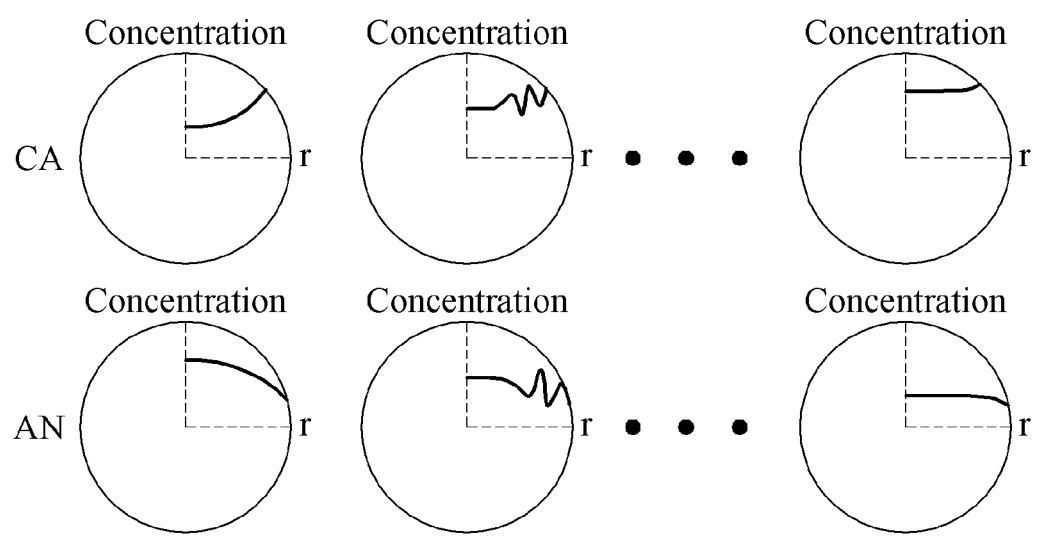

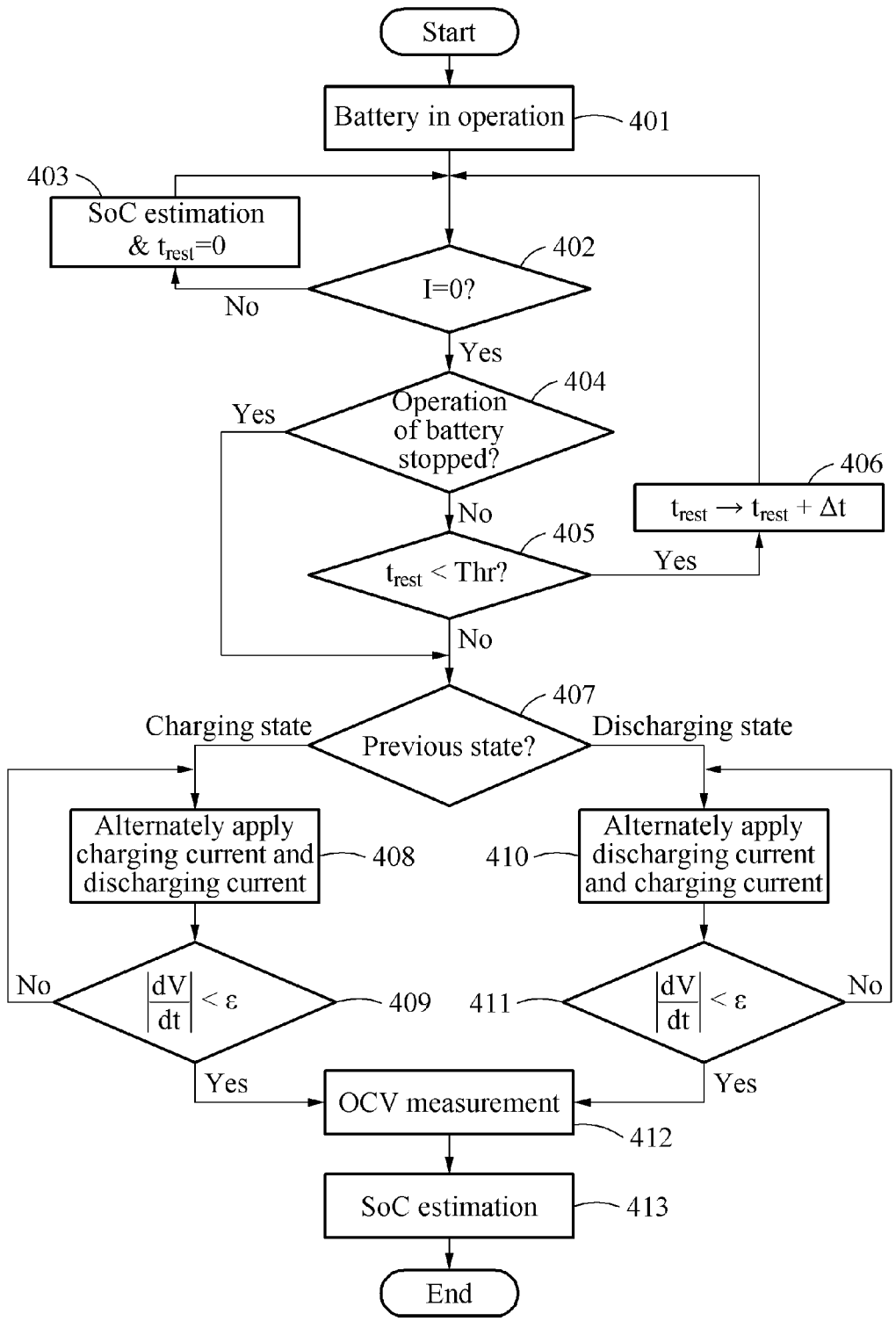

METHOD AND APPARATUS FOR ESTIMATING BATTERY STATE

CROSS-REFERENCE TO RELATED APPLICATIONS

This application claims the benefit under 35 USC § 119(a) of Korean Patent Application No. 10-2016-0152544 filed on Nov. 16, 2016 in the Korean Intellectual Property Office, the entire disclosure of which is incorporated herein by reference for all purposes.

BACKGROUND

1. Field

The following description relates to technology for estimating a state of a battery.

2. Description of Related Art

A battery is used as a power source, for example, of a mobile device, an electric vehicle, etc. To stably use the battery during a relatively long lifespan of the battery, it is very important to accurately estimate the charging state of the battery. If the charging state of the battery is inaccurately estimated, overcharging or over-discharging may occur during charging or discharging of the battery.

A variety of schemes have been proposed to estimate the charging state of the battery. A current integration method, for example, an Ah method or a Coulomb counting method, is a method of estimating state of charge (SOC) based on a charging/discharging current and time of the battery, and a resistance measurement method is a method of estimating SOC based on a relationship between an internal resistance of the battery and the SOC. The current integration method and the resistance measurement method may estimate a charging state of a battery in operation, however, do not apply an internal electrochemical characteristic of the battery once the operation of the battery is terminated. A voltage measurement method estimates SOC based on an open circuit voltage (OCV) of the battery and thus, may estimate an initial charging state of the battery that operates again after the operation of the battery is terminated.

To estimate the charging state of the battery based on the OCV of the battery, a predetermined amount of time is required to stabilize an internal state of the battery. Also, an OCV determined based on the charging of the battery and the discharging of the battery do deviate at the same SOC. This phenomenon is referred to as an OCV hysteresis. Due to the OCV hysteresis, an error may occur in estimating the battery state. Accordingly, there is a need for technology for further accurately estimating the state of a battery and reducing the stabilization time of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of estimating a battery state includes determining whether a previous state of a battery in a rest state is a charging state or a discharging state, selecting a current profile including a charging pulse and a discharging pulse based on the previous state of the battery, stabilizing an open circuit voltage (OCV) of the battery by applying the current profile to the battery, and measuring the stabilized OCV.

A total amount of current of the charging pulse may be equal to a total amount of current of the discharging pulse.

The selecting may include selecting a current profile in a form that starts with a charging pulse in response to the previous state of the battery being determined to be the charging state.

The selecting may include selecting a current profile in a form that starts with a discharging pulse in response to the previous state of the battery being determined to be the discharging state.

The stabilizing may include measuring an instantaneous rate of change of voltage of the battery, and determining whether the OCV of the battery is stabilized based on whether a magnitude of the instantaneous rate of change of voltage is less than a threshold.

The battery state estimation method may further include estimating a state of charge (SOC) of the battery based on the measured OCV.

The estimating may include estimating the SOC by referring to a lookup table corresponding to the stabilized OCV.

The battery state estimation method may further include determining whether the battery is in the rest state. The rest state may include at least one of a case in which a charging current or a discharging current is α due to passing of a predetermined time during an operation of the battery and a case in which the battery is stopped in response to passing of the predetermined time and then operated.

The determining may include determining whether the previous state of the battery is the charging state or the discharging state based on at least one of an instantaneous rate of change of an SOC of the battery in the rest state and an accumulation amount of instantaneous rate of changes during a predetermined time.

The current profile may be in a form in which at least one rest period is inserted between the alternately included charging pulse and discharging pulse.

In another general aspect, an apparatus for estimating a battery state includes a processor configured to determine whether a previous state of a battery in a rest state is a charging state or a discharging state, to select a current profile in a form that alternately includes charging pulse and discharging pulse based on a result of the determining, to stabilize an OCV of the battery by applying the current profile to the battery, to measure the stabilized OCV, and to estimate a SOC of the battery based on the measured OCV.

Other features and aspects will be apparent from the following detailed description, the drawings, and the claims.

BRIEF DESCRIPTION OF THE DRAWINGS

FIG. 1 is a flowchart illustrating an example of a battery state estimation method.

FIG. 2A illustrates an example of a process of stabilizing an open circuit voltage (OCV) based on a current profile.

FIG. 2B illustrates an example of a process of stabilizing a concentration distribution within a battery based on a current profile.

FIG. 4 is a flowchart illustrating an example of a battery state estimation method.

Figure 3A:
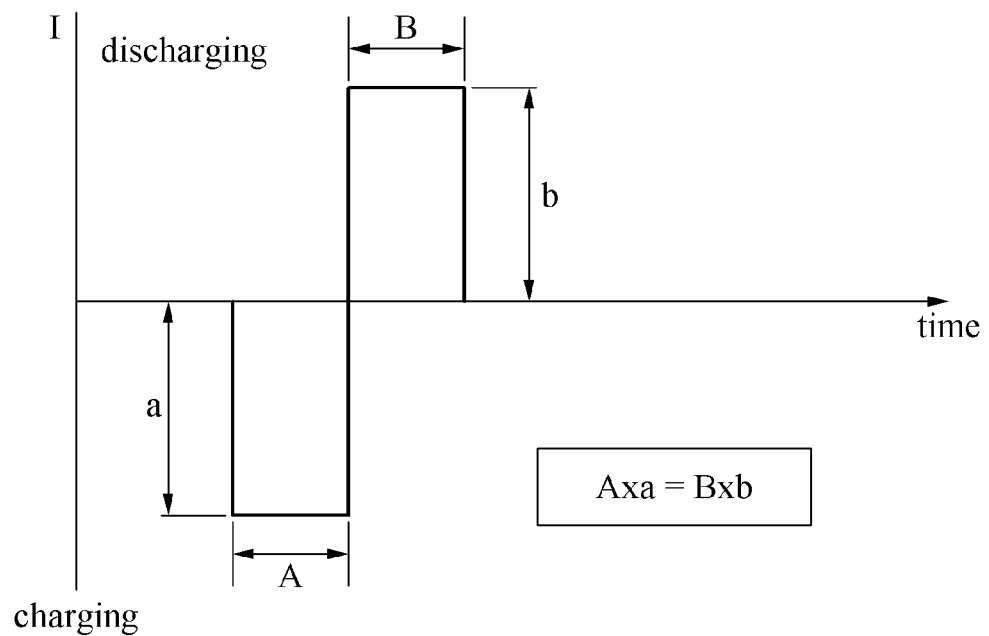
FIGS. 3A through 3D illustrate examples of a current profile.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following structural or functional descriptions are exemplary to merely describe the examples, and the scope of the examples is not limited to the descriptions provided in the present specification. Various changes and modifications can be made thereto by those of ordinary skill in the art.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

Hereinafter, examples will be described in detail with reference to the accompanying drawings, and like reference numerals in the drawings refer to like elements throughout.

FIG. 1 illustrates an example of a battery state estimation method.

Referring to FIG. 1, in operation 101, a battery state estimation apparatus determines whether a previous state of a battery in a rest state is a charging state or a discharging state. The battery may include an electric condenser or a secondary cell configured to store power by charging. A device that uses the battery may supply the power from the battery to a load. The load is an entity that consumes power and the power may be externally supplied. For example, the load may be an electric heater, a light, or a motor of an electric vehicle that consume power using a circuit in which current flows at a specific voltage. Here, the battery of which a state is to be estimated may include one or more battery packs that include a plurality of battery modules, one or more battery modules within the battery pack, a battery module that includes a plurality of battery cells, one or more battery cells within the battery module, a representative module that represents a plurality of battery modules, and a representative cell that represents a plurality of battery cells. Hereinafter, the battery is understood to refer to any one or combination of the above examples.

The battery state estimation apparatus estimates the state of the battery, and may be configured as a software module, a hardware module, and/or various combinations thereof. For example, the battery state estimation apparatus may be configured by a battery management system (BMS). The BMS is a system that manages the battery, and for example, monitors the state of the battery, maintains an optimal condition for an operation of the battery, predicts a replacement timing of the battery, detects a fault of the battery, generates a control signal or a command signal associated with the battery, and/or controls the state or the operation of the battery.

The rest state of the battery includes a state in which the battery is not being charged or discharged. For example, the rest state includes a case in which the charging current or the discharging current is 0 due to passing of a predetermined time during an operation of the battery, and/or the battery is stopped due to passing of the predetermined time and then operates.

The previous state of the battery in the rest state indicates the battery state before the battery enters into the rest state. The battery state estimation apparatus may determine whether the battery is being charged or discharged, that is, whether the battery is in a charging state or in a discharging state before entering into the rest state. For example, if an electric vehicle to which the battery is mounted is currently stopped in front of a stop signal light after driving on the road, the battery state estimation apparatus determines that the battery is in the rest state and that the previous state of the battery in the rest state is the discharging state. If the electric vehicle in which the battery is mounted is currently stopped after driving on a downhill road, the battery state estimation apparatus may determine that the battery is in the rest state and that the previous state of the battery in the rest state is in the charging state. In the case of driving on the downhill road, the battery may be charged through regenerative braking. If the ignition of the electric vehicle of which battery charging is completed is turned off and then turned on at a charging station, the battery state estimation apparatus may determine that the battery is in the rest state and may determine that the previous state of the battery in the rest state is the charging state.

The battery state estimation apparatus may determine whether the previous state of the battery is the charging state or the discharging state based on an instantaneous rate of change of a state of charge (SOC) of the battery in the rest state and/or an accumulation amount of instantaneous rate of changes during a predetermined time. The SOC is a parameter that indicates the charging state of the battery. The SOC represents a level of energy stored in the battery and the amount of SOC may be expressed as 0 to 100% using a percentage (%) unit. For example, 0% denotes a completely discharged state and 100% denotes a fully charged state. The representation scheme may be modified and defined based on design intent or examples. The instantaneous rate of change of SOC indicates an instantaneous rate of change of SOC over time. Since the SOC increases or decreases due to charging or discharging, the battery state estimation apparatus may verify the previous state of the battery in the rest state based on the instantaneous rate of change of SOC. For example, the battery state estimation apparatus determines whether the previous state of the battery is the charging state or the discharging state by deriving a gradient from a function of the SOC over time by performing a differential operation.

Referring again to FIG. 1, after determining whether the previous state of the battery in a rest state is a charging state or a discharging state in operation 101, in operation 102, the battery state estimation apparatus selects a current profile in a form that alternately includes at least one charging pulse and at least one discharging pulse based on the result. Here, the current profile represents a policy for determining a scheme for applying a charging pulse or a discharging pulse to the battery, and may be defined as a form that includes at least one charging pulse and at least one discharging pulse. A charging pulse or a discharging pulse is a pulse to be applied to the battery of which the state is to be estimated, and includes a charging current or a discharging current in a pulse form. In response to applying the charging pulse to the battery, a charging current flows in the battery. In response to applying the discharging pulse to the battery, a discharging current flows out from the battery. A physical quantity, for example, the shape of the pulse over time, amplitude, pulse unit, etc., used to define the charging pulse or the discharging pulse may be variously modified and configured based on the design intent.

In one example, the current profile is defined in a form that alternately includes at least one charging pulse and at least one discharging pulse. Here, the total amount of current of the charging pulse may be equal to the total amount of current of the discharging pulse. Although the current profile defined in a form in which the amount of current of charging pulses and discharging pulses are different is applied to the battery, it is possible to prevent overcharging or overdischarging from occurring in the battery compared to a current state by equalizing a amount of current between the charging pulses and the discharging pulses. Also, although the current profile defined in the form in which the amount of current of charging pulses and discharging pulses are different may be applied to a battery pack, a battery module, a battery cell, a representative module, or a representative cell, it is possible to prevent a charging state between a battery to which the current profile is applied and a battery to which the current profile is not applied from varying by equalizing a amount of current between the charging pulses and the discharging pulses.

If the previous state of the battery is the charging state, the battery state estimation apparatus selects a current profile in a form that starts with a charging pulse. In this example, the current profile is designed to apply charging pulses and discharging pulses to the battery sequentially in a pattern of charging pulse->discharging pulse.

If the previous state of the battery is the discharging state, the battery state estimation apparatus selects a current profile in a form that starts with a discharging pulse. In this example, the current profile is designed to apply charging pulses and discharging pulses to the battery sequentially in a pattern of discharging pulse->charging pulse. Here, setting the order of the charging pulse and the discharging pulse is modified based on the design intent; thus, not limited to the aforementioned patterns.

In operation 103, the battery state estimation apparatus stabilizes an open circuit voltage (OCV) of the battery by applying the current profile to the battery. The OCV refers to the battery voltage in a state in which an internal circuit is open, and is measured or estimated as a value to which the battery voltage converges over time from a state in which a current flowing in the battery is 0.

FIG. 2A illustrates an example of a process of stabilizing an OCV based on a current profile.

Referring to an upper graph of FIG. 2A, a battery is being discharged with a discharging current of the battery constantly flowing and a discharging current of 0 is applied to the battery at a certain point in time. Here, a positive current indicates discharging of the battery and a negative current indicates charging of the battery. The voltage of the battery decreases in response to discharging of the battery. The voltage of the battery converges to a predetermined voltage value from a point in time at which the discharging current becomes zero and discharging of the battery is stopped. In one example, the OCV of the battery is estimated based on a value to which the voltage of the battery converges.

An OCV stabilization time 204 denotes an amount of time used to estimate the OCV of the battery. In detail, the OCV stabilization time 204 denotes an amount of time used to stabilize the voltage of the battery in a rest state through constant convergence to a level that allows OCV estimation. In one example, the OCV stabilization time is about 30 minutes. The amount of time used to estimate the OCV increases in response to an increase in the OCV stabilization time. Thus, the OCV stabilization time needs to be reduced.

Referring to a lower graph of FIG. 2A, the battery state estimation apparatus stabilizes the OCV of the battery by applying a current profile 201 to the battery in the rest state. Stabilizing the OCV of the battery means enabling an operation where the voltage of the battery constantly converges to a predetermined voltage value and reducing an OCV stabilization time to estimate the OCV of the battery. The battery state estimation apparatus applies the current profile 201 that starts with a discharging pulse to the battery based on the fact that a previous state of the battery in the rest state is a discharging state. The battery state estimation apparatus reduces the OCV stabilization time of the battery by applying the current profile 201 to the battery in the rest state.

Referring to the lower graph of FIG. 2A, by applying the current profile 201 to the battery, the OCV of the battery is stabilized and the OCV stabilization time 201 is reduced compared to the OCV stabilization time 204 in which the current profile 201 is not applied. A voltage 207 of the battery over time, when the current profile 201 is applied to the battery in the rest state, further quickly converges to the OCV compared to a voltage 206 of the battery over time when the current profile is not applied to the battery.

If the difference between a specific voltage and a voltage of the battery at a specific point in time after the OCV stabilization time 204 is elapsed is ΔV 205, a difference ΔV 203 of the battery to which the current profile 201 is applied is less than the difference ΔV 205 of the battery to which the current profile 201 is not applied. An OCV of the battery to which the current profile 201 is applied is greater than the battery to which the current profile 201 is not applied. Accordingly, the battery state estimation apparatus reduces OCV estimation errors based on OCV hysteresis by applying the current profile 201 to the battery in the rest state. Dissimilar to FIG. 2A, if the previous state of the battery in the rest state is a charging state, the difference ΔV 203 of the battery to which the current profile 201 is applied is reduced and ΔV of the battery is estimated as a relatively small value compared to a case in which the current profile 201 is not applied.

In one example, the battery state estimation apparatus iteratively applies a current profile to a battery to stabilize an OCV of the battery. The battery state estimation apparatus determines whether the OCV of the battery is stabilized, and iteratively applies the current profile to the battery based on a determination result. Here, the current profile to be additionally applied is designed to be different from the initially applied current profile.

The battery state estimation apparatus measures an instantaneous rate of change of the battery to determine whether the OCV is stabilized. Here, the instantaneous rate of change indicates an instantaneous rate of change of voltage over time. The battery state estimation apparatus compares a magnitude of the instantaneous rate of change of voltage to a threshold. If the magnitude of the instantaneous rate of change of voltage is less than the threshold, the battery state estimation apparatus determines that the OCV of the battery is stabilized.

FIG. 2B illustrates an example of a process of stabilizing a concentration distribution within a battery based on a current profile.

The battery stores energy using an electrochemical reaction between ions, for example, positive ions with positive charge present around particles of a cathode and ions, for example, negative ions with negative charge present around particles of an anode. In response to charging or discharging of the battery, the concentration distribution of positive ions present inside and around particles of the cathode and the concentration distribution of negative ions present inside and around particles of the anode vary. If the battery is in a rest state, the concentration distribution inside and around particles of the cathode and the concentration distribution inside and around particles of the anode may be stabilized. With the stabilization of the concentration distributions, the OCV of the battery may also be stabilized. The stabilization of the concentration distributions associated with the cathode and the anode indicates that the concentration distribution from the internal center to the surface of particles of the cathode and the anode becomes constant.

FIG. 2B shows the concentration distribution of positive ions inside and around particles of the cathode CA and the concentration distribution of negative ions inside and around particles of the anode AN. Here, although a particle of the cathode CA and a particle of the anode AN are illustrated to be in a planar form, they may be in a form of a three-dimensional (3D) sphere. In the graphs of FIG. 2B, x axis denotes a radius r and y axis denotes concentration, for example, lithium (Li) concentration. The battery state estimation apparatus may apply a current profile, for example, the current profile 201 of FIG. 2A to the battery in the rest state. Leftmost graphs show the concentration distributions inside and around particles before the current profile 201 is applied. Center graphs show the concentration distributions varying based on the particle surface by applying the current profile 201 to the battery. Rightmost graphs show the concentration distributions being gradually stabilized inside and around particles.

Referring again to FIG. 1, in operation 104, the battery state estimation apparatus measures the stabilized OCV. Various schemes for measuring the OCV may be employed and examples are not limited to a specific scheme.

The battery state estimation apparatus measures the SOC of the battery based on the measured OCV. In one example, the battery state charging apparatus estimates the SOC of the battery using a voltage measurement method. For example, the battery state estimation apparatus pre-stores a lookup table corresponding to the stabilized OCV. The battery state estimation apparatus acquires the lookup table corresponding to the stabilized OCV from a preconfigured database. The database is configured as a memory included in the battery state estimation apparatus, or as an external device of a server connectable to the battery state estimation apparatus in a wired or wireless manner, or over a network.

The battery state estimation apparatus uses the lookup table corresponding to the stabilized OCV. Thus, there is no need to separately manage a lookup table corresponding to a charging state and a lookup table corresponding to a discharging state, and it is possible to reduce an error in estimating the state of the battery, which occurs due to an OCV hysteresis.

In one example, the battery state estimation apparatus may estimate SOC of a battery based on a function relationship between the stabilized OCV and the SOC. Also, the battery state estimation apparatus may estimate the SOC of the battery by applying the stabilized OCV to an electric circuit or an electrochemical model.

FIGS. 3A through 3D illustrate examples of a current profile.

As described above, the current profile is designed to alternately include at least one charging pulse and at least one discharging pulse. Referring to FIGS. 3A through 3D, the total amount of current of the charging pulse the discharging pulse are equal.

Figure 3B:
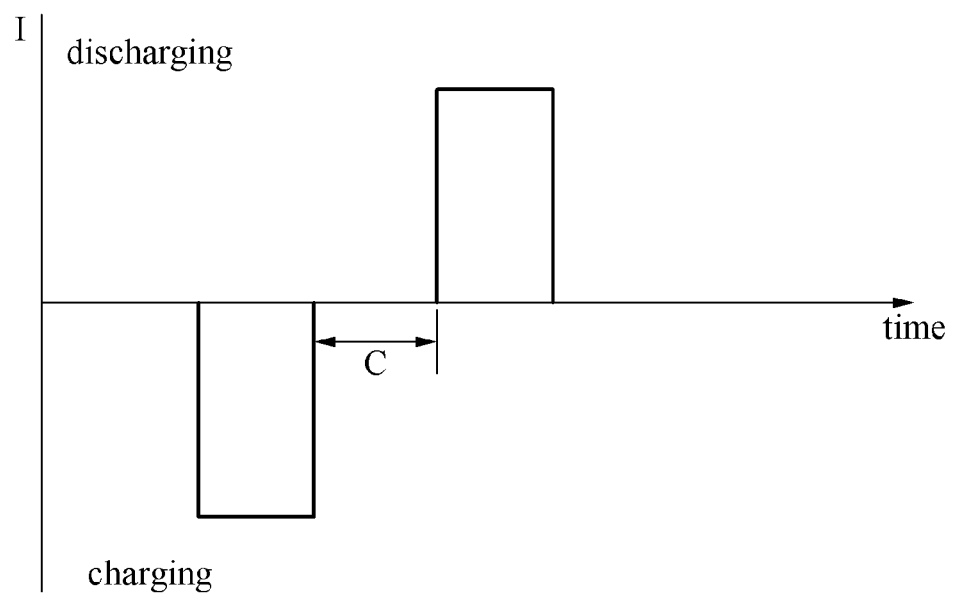

Referring to FIG. 3B, in one example, the current profile is designed in a form in which at least one rest period, for example, C of FIG. 3B, is inserted between the alternating charging pulse and discharging pulse.

Figure 3C:
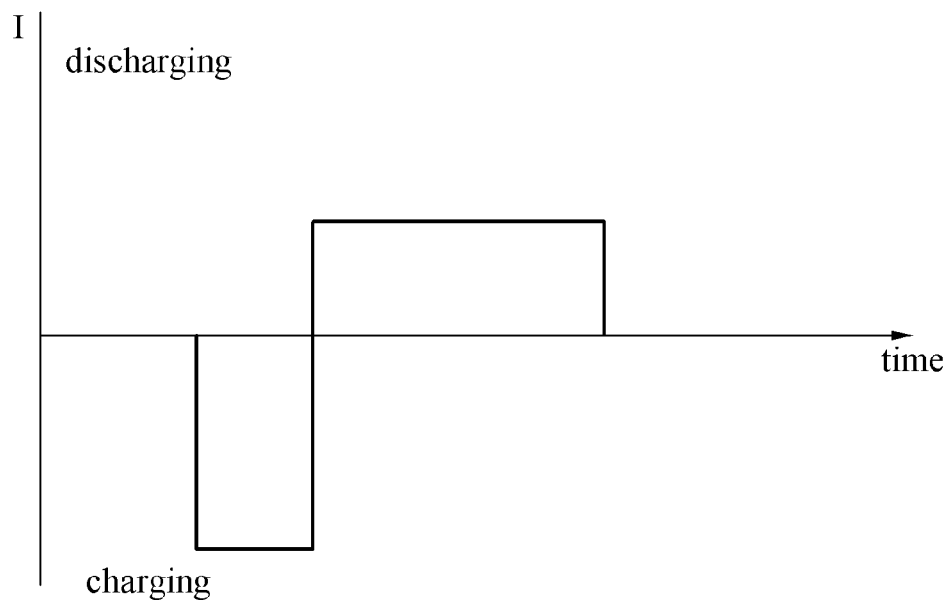
Figure 3D:
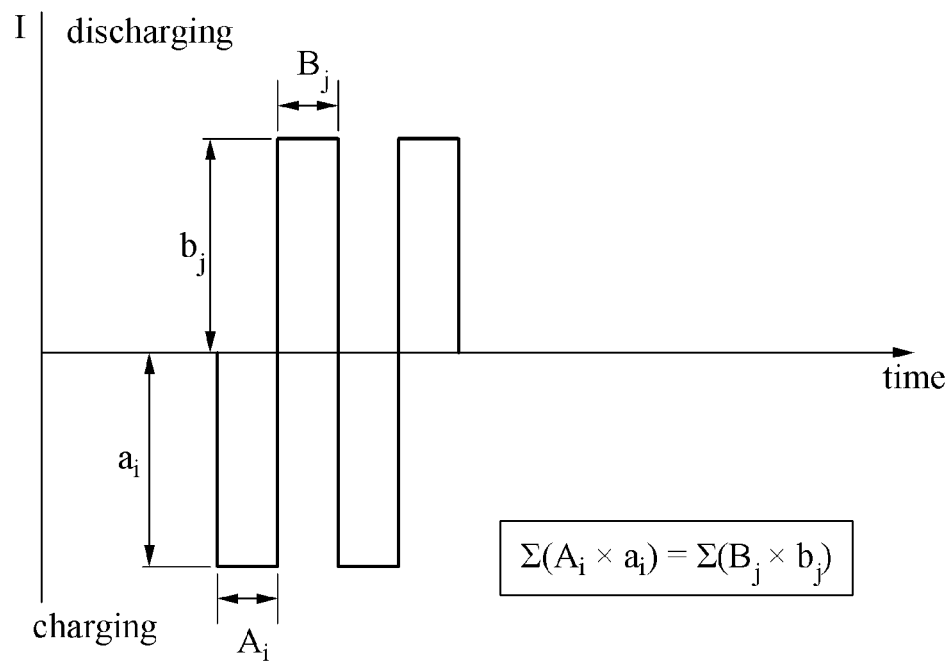

In FIG. 3C, the duration of the charging pulse is a fraction of the discharging pulse. FIG. 3D depicts the summation of charging pulse widths and amplitudes being equal to the summation of the discharging pulse widths and amplitudes. The relationship between the charging and discharging pulse widths and amplitudes is expressed as $\Sigma(A_i \times a_i) = \Sigma(B_j \times b_j)$. where A is the charging pulse width, a is the charging amplitude, i and j are integers, B is the discharging pulse width, and b is the discharging amplitude.

The current profiles of FIGS. 3A through 3D are provided as examples only and the battery state estimation apparatus may be designed so that the current profile includes various combinations and duty cycles of the charging pulse and the discharging pulse.

FIG. 4 illustrates an example of a battery state estimation method.

Referring to FIG. 4, in operation 401, a battery state estimation apparatus determines whether a battery is in operation. For example, if an electric vehicle to which the battery is mounted is driving or temporarily stopped after driving, the battery is operating.

In operation 402, the battery state estimation apparatus determines whether a charging current or a discharging current of the battery in operation is 0. Unless the charging current or the discharging current of the battery is 0, the battery state estimation apparatus determines that $t_{rest}$ is 0 and estimates SOC of the battery in operation 403. Here, $t_{rest}$ denotes an amount of time in which the charging current or the discharging current of the battery is maintained to be 0. The battery of which $t_{rest}$ is 0 is not in the rest state. Thus, the battery state estimation apparatus estimates the SOC of the battery using at least one of a current integration method, a resistance measurement method, and an electrochemical model estimation method, or various combinations thereof.

If the charging current or the discharging current of the battery is 0, the battery state estimation apparatus determines whether the operation of the battery is suspended in operation 404. If the operation of the battery is suspended, the battery is in the rest state and the battery state estimation apparatus determines whether a previous state of the battery in the rest state is a charging state or a discharging state in operation 407.

If the operation of the battery is not suspended, the battery state estimation apparatus determines whether $t_{rest}$ is less than a threshold in operation 405. If is less than the threshold, the battery state estimation apparatus adds a predefined time Δt to $t_{rest}$ in operation 406, and determines whether the charging current or the discharging current of the battery is 0 in operation 402.

If the previous state of the battery is the charging state, the battery state estimation apparatus alternately applies charging current and discharging current to the battery in operation 408. As described above, the battery state estimation apparatus may alternately apply the charging current and the discharging current by applying a current profile to the battery. In operation 409, the battery state estimation apparatus determines whether a magnitude of an instantaneous rate of change of voltage of the battery to which the charging current and the discharging current are alternately applied is less than the threshold. If the magnitude of the instantaneous rate of change of voltage of the battery is less than the threshold, the battery state estimation apparatus measures a stabilized OCV of the battery in operation 412. If the magnitude of the instantaneous rate of change of voltage of the battery is greater than or equal to the threshold, the battery state estimation apparatus alternately applies again the charging current and the discharging current to the battery in operation 408.

If the previous state of the battery is the discharging state, the battery state estimation apparatus alternately applies the discharging current and the charging current to the battery in operation 410. As described above, the battery state estimation apparatus may alternately apply the discharging current and the charging current to the battery by applying the current profile to the battery. In operation 411, the battery state estimation apparatus determines whether a magnitude of an instantaneous rate of change of voltage of the battery to which the discharging current and the charging current are alternately applied is less than the threshold. If the magnitude of the instantaneous rate of change of voltage of the battery is less than the threshold, the battery state estimation apparatus measures the stabilized OCV of the battery in operation 412. If the magnitude of the instantaneous rate of change of voltage of the battery is greater than or equal to the threshold, the battery state estimation apparatus alternately applies again the discharging current and the charging current to the battery in operation 410.

In operation 413, the battery state estimation apparatus measures the SOC of the battery based on the measured OCV. The aforementioned examples associated with the SOC estimation may be applicable.

The example of stabilizing the OCV of the battery in the rest state in a case in which the battery in operation enters into the rest state is described with reference to FIG. 4. In a case in which the battery is stopped due to passing of a predetermined time and then operates, the battery state estimation apparatus may determine whether the battery is in the rest state and may stabilize the OCV of the battery in the rest state. For example, the battery mounted to the electric vehicle may operate in a battery stop state in response to turning on ignition of the electric vehicle. In one example, the battery state estimation apparatus may stabilize the OCV of the battery in the rest state by applying the aforementioned examples.

Figure 5:
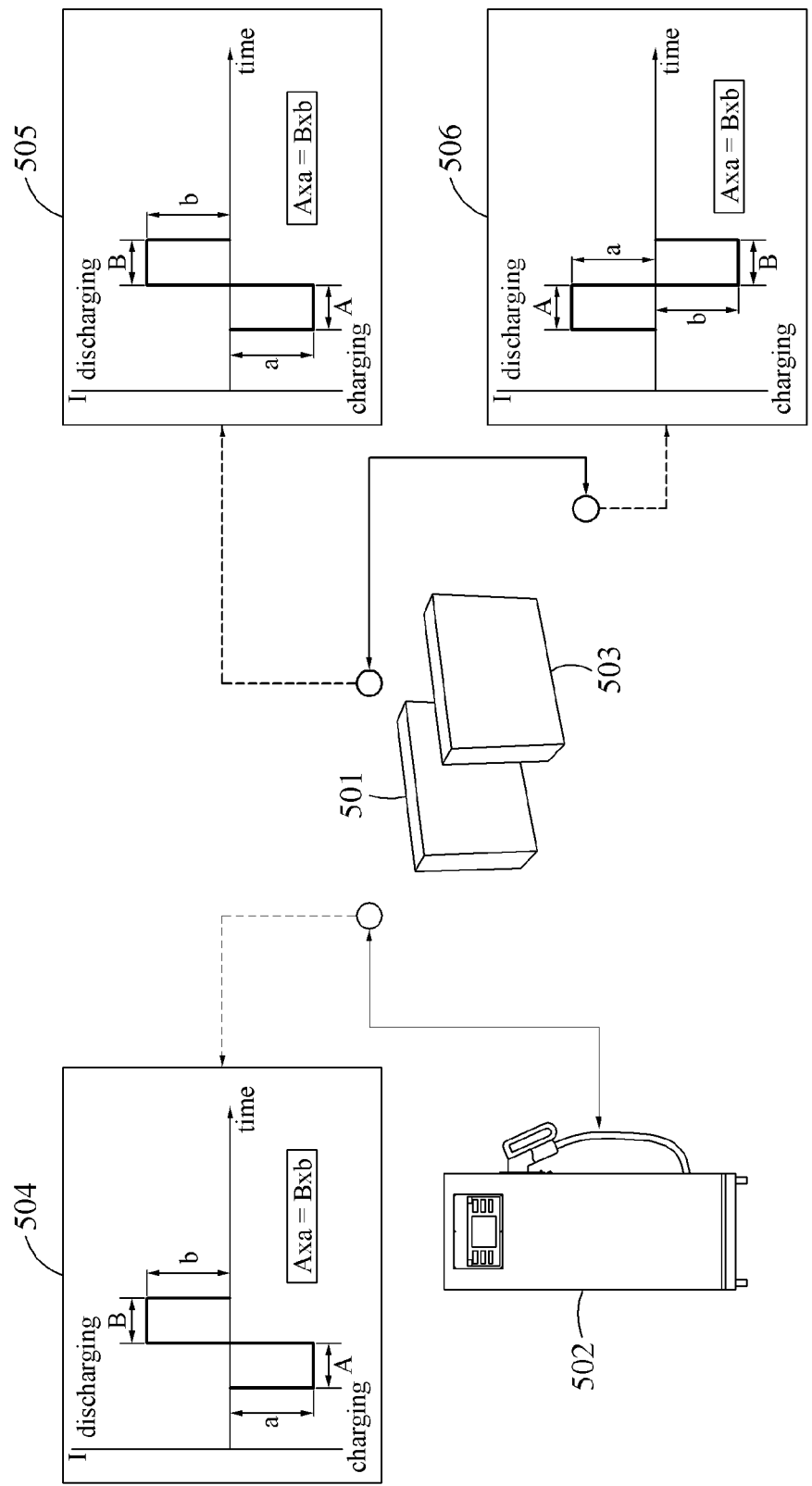
FIG. 5 illustrates an example of a source of a current profile.

FIG. 5 illustrates an example of a source of a current profile.

Referring to FIG. 5, a source of a current profile applied to a battery 501 includes an external power source 502 and an internal power source 503. The source of the current profile indicates an entity that supplies a charging pulse and a discharging pulse to be applied to the battery 501 based on the current profile.

In one example, a battery state estimation apparatus alternately applies at least one charging current and at least one discharging current to the battery 501 from the external power source 502 that is a source of the current profile 504. Alternately, charging and discharging current may be applied through a separate circuit. The external power source 502 is an independent power source separate from the battery 501 to which the current profile 504 is applied, and includes, for example, a charger of a charging station, a backup battery, and the like.

In one example, the battery state estimation apparatus alternately applies at least one charging current and at least one discharging current to the battery 501 from the internal power source 503 that is a source of the current profile 505. Alternatively, charging and discharging current may be applied through a separate circuit. The internal power source 503 includes a battery that supplies power in association with the battery 501 to which the current profile 505 is applied, and includes, for example, at least one of a battery of which a load that is a power supply target is the same as that of the battery 501, a battery module that belongs to the same battery pack as the battery 501, and a battery cell that belongs to the same battery module as the battery 501.

Referring to FIG. 5, since the internal power source 503 is the source of the current profile 505 that is applied to the battery 501, the battery 501 may become a source of the current profile 506 to be applied to the internal power source 503. In one example, the current profile 505 applied to the battery 501 and the current profile 506 applied to the internal power source 503 are provided in a symmetric form based on a time axis. Accordingly, if the internal power source 503 is used as the source of the current profile 505 applied to the battery 501, the battery state estimation apparatus simultaneously stabilizes an OCV of the battery 501 and an OCV of the internal power source 503, and constantly maintains charging states or SOC of the battery 501 and the internal power source 503.

Figure 6:
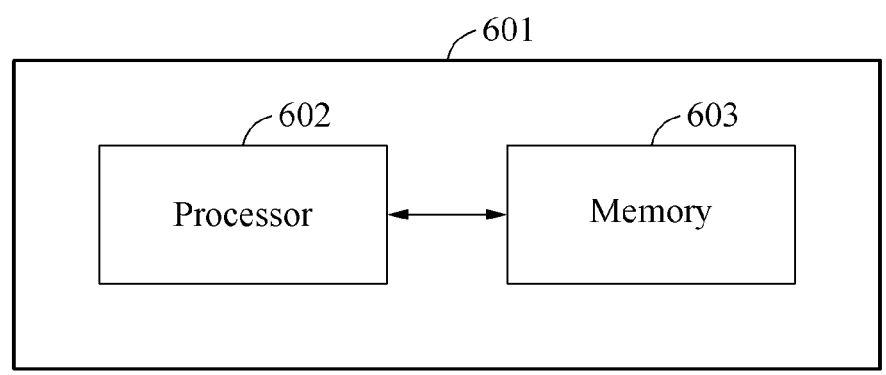
FIG. 6 is a block diagram illustrating an example of a battery state estimation apparatus.

FIG. 6 illustrates an example of a battery state estimation apparatus.

Referring to FIG. 6, a battery state estimation apparatus 601 includes a processor 602 and a memory 603. The processor 602 may include at least one of the apparatuses described with FIGS. 1 through 5, or may perform at least one of the methods described with FIGS. 1 through 5. The memory 603 stores a lookup table corresponding to a stabilized OCV of a battery or stores a program in which a battery state estimation method is configured. The memory 603 may be a volatile memory or a nonvolatile memory.

The processor 602 executes the program and controls the battery state estimation apparatus 601. A code of the program executed by the processor 602 may be stored in the memory 603. The battery state estimation apparatus 601 is connected to an external device, for example, a PC or a network through an input/output (I/O) device (not shown) and exchanges data.

Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor implemented method for an estimation of a battery state, the method comprising:
   determining respective operation states of a battery for plural times, the respective operation states being determined from among at least one of a rest state, a charging state, or a discharging state; and
   performing a determination of a current state of the battery, including:
   determining whether a previous operation state of the battery, previous to a determined current operation state of the battery being the rest state, is the charging state or the discharging state;
   selecting, based on which of the charging state and the discharging state the previous operation state is determined to have been, a current profile in a form that alternately includes at least one charging pulse and at least one discharging pulse;

performing a stabilizing of an open circuit voltage (OCV) of the battery by controlling current of the battery according to the selected current profile; and estimating a battery state of the battery based on a measuring of a subsequent OCV of the battery resulting from the performing of the stabilizing.

2. The method of claim 1, wherein a total amount of current of the charging pulse is equal to a total amount of current of the discharging pulse.

3. The method of claim 1, wherein the current profile is selected in a form that starts with a charging pulse in response to the previous operation state being determined to be the charging state.

4. The method of claim 1, wherein the current profile is selected by selecting the current profile in a form that starts with a discharging pulse in response to the previous operation state being determined to be the discharging state.

5. The method of claim 1, wherein the performing of the stabilizing comprises:

measuring an instantaneous rate of change of voltage of the battery;

determining whether OCV stabilization of the battery is achieved based on a determination of whether a magnitude of the instantaneous rate of change of voltage is less than a threshold; and performing the estimating of battery state of the battery in response to the magnitude being determined to be less than the threshold.

6. The method of claim 1, wherein the battery state of the battery is a state of charge (SOC) of the battery.

7. The method of claim 6, wherein the estimating of the SOC comprises:

estimating the SOC based on a lookup table corresponding to the subsequent OCV.

8. The method of claim 1, further comprising:

determining whether the current operation state of the battery is the rest state, wherein the determining of whether the current operation state of the battery is the rest state is dependent on one or both of a charging current and a discharging current being 0 due to passing of a predetermined time during an operation of the battery, and the battery being stopped due to passing of the predetermined time and then operating.

9. The method of claim 1, wherein the determining of whether the previous operation state is the charging state or the discharging state is based on consideration of one or both of an instantaneous SOC rate of change in the current operation state of the battery, and an accumulation amount of instantaneous rate of changes during a predetermined time.

10. The method of claim 1, wherein the current profile is in a form in which at least one rest period is inserted between the alternately included at least one charging pulse and at least one discharging pulse.

11. A non-transitory computer-readable medium storing program instructions that, when executed by a processor, cause the processor to perform the method of claim 1.

12. An apparatus, the apparatus comprising:

a processor configured to:

determine respective operation states of a battery for plural times, the respective operation states being determined from among at least one of a rest state, a charging state, or a discharging state; and perform a determination of a current state of the battery, wherein, to perform the determination of the current state of the battery, the processor is further configured to:

determine whether a previous operation state of the battery, previous to a determined current operation state of the battery being the rest state, is the charging state or the discharging state;

select, based on which of the charging state and the discharging state the previous operation state is determined to have been, a current profile in a form that alternately includes at least one charging pulse and at least one discharging pulse;

perform a stabilization of an open circuit voltage (OCV) of the battery by controlling current of the battery according the selected current profile;

measure a subsequent OCV of the battery resulting from the performed stabilization; and estimate a state of charge (SOC) of the battery based on the measured subsequent OCV.

13. The apparatus of claim 12, wherein a total amount of current of the charging pulse is equal to a total amount of current of the discharging pulse.

14. The apparatus of claim 12, wherein the processor is further configured to select the current profile in a form that starts with a charging pulse in response to the previous operation state being determined to be the charging state.

15. The apparatus of claim 12, wherein the processor is further configured to select the current profile in a form that starts with a discharging pulse in response to the previous operation state being determined to be the discharging state.

16. The apparatus of claim 12, wherein the processor is further configured to measure an instantaneous rate of change of voltage of the battery, determine whether OCV stabilization of the battery is achieved based on whether a magnitude of the instantaneous rate of change of voltage is less than a threshold, and to perform the estimation of the SOC in response to the magnitude being determined less than the threshold.

17. The apparatus of claim 12, further comprising:

a memory configured to store a lookup table corresponding to the subsequent OCV, wherein the processor is further configured to perform the estimation of the SOC based on the lookup table.

18. The apparatus of claim 12, wherein the processor is further configured to determine whether the current operation state of the battery is the rest state, and the determination of whether the current operation state of the battery is the rest state is dependent on one or both of a charging current or a discharging current being 0 due to passing of a predetermined time during an operation of the battery, and the battery being stopped due to passing of the predetermined time and then operating.

19. The apparatus of claim 12, wherein the processor is further configured to perform the determination of whether the previous battery rest state is the charging state or the discharging state based on consideration of one or both of an instantaneous SOC rate of change and an accumulation amount of instantaneous rate of changes during a predetermined time.

20. The apparatus of claim 12, wherein the current profile is in a form in which at least one rest period is inserted between the alternately included at least one charging pulse and at least one discharging pulse.

* * * * *